US009264075B2

(12) United States Patent
Schoppmeier (10) Patent No.: US 9,264,075 B2
(45) Date of Patent: *Feb. 16, 2016

(54) DYNAMIC BUFFER PARTITIONING (71) Applicant: Lantiq Deutschland GmbH, Neubiberg (DE)

(72) Inventor: Dietmar Schoppmeier, Unterhaching (DE)

(73) Assignee: Lantiq Beteiligungs-GmbH & Co.KG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/621,412

(22) Filed: Feb. 13, 2015

(65) Prior Publication Data

US 2015/0180510 A1 Jun. 25, 2015

Related U.S. Application Data (63) Continuation of application No. 13/606,677, filed on Sep. 7, 2012, now Pat. No. 8,977,932.

(30) Foreign Application Priority Data

Sep. 9, 2011 (EP) .................................... 11007371

(51) Int. Cl.
*H03M 13/00* (2006.01)
*H03M 13/27* (2006.01)
*H04L 1/00* (2006.01)
*G06F 3/06* (2006.01)

(52) U.S. Cl.
CPC ......... *H03M 13/2792* (2013.01); *G06F 3/0613* (2013.01); *G06F 3/0631* (2013.01); *G06F 3/0673* (2013.01); *H04L 1/0045* (2013.01); *H04L 1/0071* (2013.01)

(58) Field of Classification Search
CPC ... H04L 1/0071; H04L 1/0041; H04L 1/0056; H04L 49/9005; H04L 1/0045; H04B 1/38; G06F 3/0613; G06F 3/0631
USPC .......... 714/773, 701, 702, 758, 788; 455/450, 455/452.1
See application file for complete search history.

(56) References Cited

U.S. PATENT DOCUMENTS

| 7,519,124 | B2 * | 4/2009 | Oksman et al. ............... 375/260 |
| 7,831,890 | B2 | 11/2010 | Tzannes et al. |
| 7,856,033 | B2 | 12/2010 | Oksman et al. |
| 7,865,796 | B2 | 1/2011 | Irving |
| 8,190,848 | B2 | 5/2012 | Thyagarajan |

(Continued)

FOREIGN PATENT DOCUMENTS

WO 2006044227 A1 4/2006

OTHER PUBLICATIONS

Extended European Search Report issued by the European Patent Office on Mar. 23, 2012.

(Continued)

*Primary Examiner* — Christine Tu (57) ABSTRACT

At least one implementation herein enables interleaver and deinterleaver buffer modification during Showtime. That is, at least one implementation herein enables a multicarrier controller apparatus to reallocate interleaver and deinterleaver buffer memory to accommodate data rate changes in the upstream and downstream communication channels.

18 Claims, 3 Drawing Sheets

(56) References Cited

U.S. PATENT DOCUMENTS

| | | | |
|---|---|---|---|
| 8,276,048 B2 * | 9/2012 | Tzannes et al. | 714/774 |
| 8,335,956 B2 * | 12/2012 | Tzannes | 714/748 |
| 8,347,062 B2 | 1/2013 | Thyagarajan | |
| 8,351,537 B2 | 1/2013 | Heise | |
| 8,977,932 B2 * | 3/2015 | Schoppmeier | 714/773 |

OTHER PUBLICATIONS

Office Action issued by the European Patent Office on Jun. 23, 2014.

* cited by examiner

DYNAMIC BUFFER PARTITIONING

REFERENCE TO RELATED APPLICATIONS

This application is a Continuing application of co-pending patent application Ser. No. 13/606,677, which was filed on Sep. 7, 2012. patent application Ser. No. 13/606,677 claimed priority benefit of European Patent Application 11007371.5 filed on Sep. 9, 2011. The entire contents of the indicated prior application Ser. No. 13/606,677 and 11007371.5 are hereby incorporated by reference herein.

BACKGROUND

Digital subscriber line (DSL) technology provides high-speed data transfer between two modems across ordinary telephone lines, wherein digital data transfer rates from tens of Kbps to tens of Mbps are supported over standard (e.g., twisted pair) telephone lines, while still providing for plain old telephone service (POTS). Asynchronous Digital Subscriber Line (ADSL) and Very High Digital Subscriber Line (VDSL) have emerged as popular implementations of DSL systems, where ADSL is defined by American National Standard Institute (ANSI) standard T1.413 and International Telecommunication Union (ITU-T) standards G.992.3, G.992.5, and VDSL is defined by ANSI standard T1.424 and ITU-T standard G.993.2. ADSL, VDSL and other similar DSL systems (collectively referred to as "xDSL") typically provide digital data transfer in a frequency range above the POTS band (e.g., about 300 Hz to 4 kHz), for example ADSL G.992.3 operates at frequencies from about 25 kHz to about 1.1 MHz.

Interleaving is a technique used in data communication systems for protecting codewords or other data words against burst errors that occur during data transmission. Several consecutive bits of a data stream are corrupted during transmission when a burst error occurs, e.g., due to impulse noise. Error correction schemes that expect errors to be more uniformly distributed can be overwhelmed when burst errors occur. Data is often transmitted with error control bits that enable the receiver to correct a certain number of errors that occur during transmission. However, if too many errors occur within a codeword, the codeword cannot be correctly decoded despite use of an error correction scheme. To mitigate burst errors, the codeword bits are typically interleaved before being transmitted. This way, bits from the same codeword are not transmitted in consecutive order. Instead, the codewords are broken up and the bits from different codewords are consecutively transmitted. A burst error is much less likely to corrupt a codeword because the codeword bits are more uniformly distributed during data transmission. Receivers are more capable of correctly decoding transmitted codewords when interleaving is used.

Many types of data communication systems that employ interleaving are provided a fixed amount of memory to be allocated between interleaving and de-interleaving operations. For example, DSL (digital subscriber loop) modems such as VDSL and VDSL2 modems are typically provided a total memory size (in terms of delay octets) to be allocated between a downstream interleaver buffer and an upstream de-interleaver buffer. Codewords are interleaved in the downstream direction (i.e., from a provider or operator to a subscriber) and de-interleaved in the upstream direction (i.e., from the subscriber to the service provider or operator). The protection capability of the interleaver depends on the size of the interleaver buffer. The amount of interleaver buffer memory (interleaver depth) is typically proportional to the data rate, maximum delay and the required minimum impulse noise protection for the downstream and upstream flows.

The fixed memory is ideally allocated so that a desired noise protection capability is achieved while maintaining optimal upstream and downstream data rates. However, the optimal upstream and downstream data rates depend on actual channel conditions and interleaver memory allocation is typically performed before channel conditions are known to the modem (e.g., before Showtime). For example, DSL modems typical allocate memory between interleaver and de-interleaver buffers based on data rate, maximum delay and impulse noise protection configuration parameters provided to the modem as part of the MIB (management information base). These parameters represent worse-case, best-case or expected channel conditions. Therefore, the memory may not be optimally allocated between the interleaver and de-interleaver under some conditions.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

Overview

At least one implementation herein enables interleaver and deinterleaver buffer modification during Showtime, or before Showtime and after initialization (e.g., training). That is, at least one implementation herein enables a multicarrier controller apparatus to reallocate interleaver and deinterleaver buffer memory to accommodate data rate changes in the upstream and downstream communication channels.

Exemplary Communication Arrangement

Figure 1:
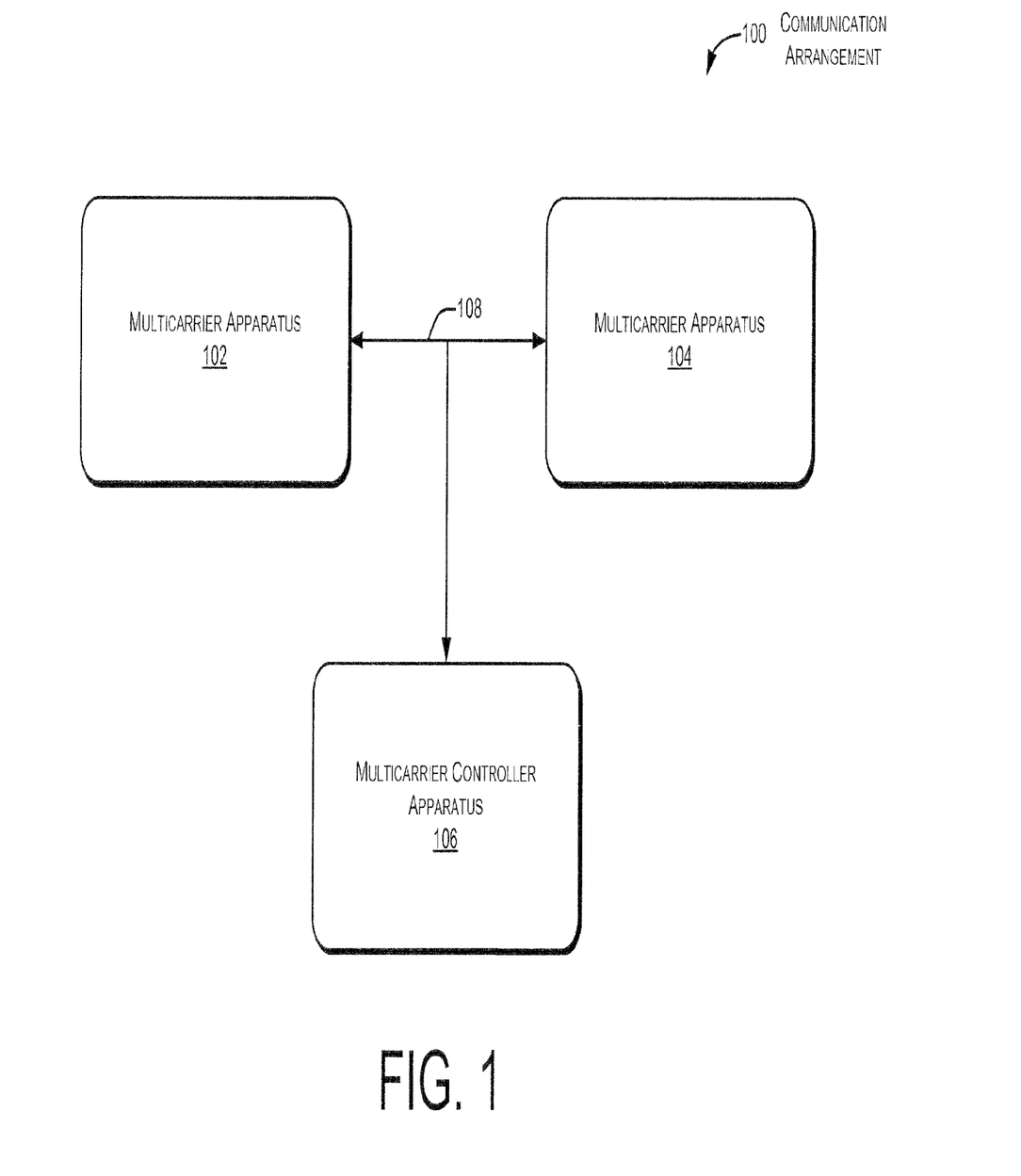
FIG. 1 illustrates an exemplary communication arrangement that employs a plurality of multicarrier apparatuses. In one implementation, the multicarrier apparatuses are Orthogonal Frequency Division Multiplexing (OFDM) apparatuses capable of implementing the described power management procedures.

FIG. 1 illustrates an exemplary communication arrangement 100 that employs at least two multicarrier apparatuses or nodes 102 and 104. The exemplary communication arrangement 100 may also employ a multicarrier controller apparatus or controller node 106. In one implementation, the multicarrier apparatuses 102, 104 and 106 are Orthogonal Frequency Division Multiplexing (OFDM) apparatuses capable of implementing the herein implementations.

The multicarrier apparatuses 102, 104 and 106 may communicate through a communication channel 108. The communication channel 108 may be realized as a wireless communication medium, a wireline communication medium (e.g., coaxial cable, twisted pair of copper wires, power line wiring, optical fiber, etc.), or combinations thereof. Accordingly, the multicarrier apparatuses 102, 104 and 106 may include structure and functionality that enable signal communication over such medium. Such structure and functionality may include one or more antennas, integrated wireline interfaces, and the like. Depending on the implementation, the multicarrier apparatuses 102, 104 and 106 may communicate with one another directly (peer-to-peer mode) or the multicarrier apparatuses 102 and 104 may communicate via the controller apparatus 106.

In one implementation, the exemplary communication arrangement 100 may be a home network and the multicarrier controller apparatus 106 may be an access point of the home network. For example, in the implementation the controller apparatus 106 may be a residential gateway that distributes broadband services to the multicarrier apparatuses 102 and 104. The multicarrier apparatuses 102 and 104 may be associated with digital content destinations in the home, but may also be associated with digital content sources, such as digital video recorders (DVR), computers providing streaming video, televisions, entertainment centers, and the like.

Furthermore, the multicarrier apparatuses 102, 104 and 106 may be enabled to communicate using packet-based technology (e.g., ITU G.hn, HomePNA, HomePlug® AV and Multimedia over Coax Alliance (MoCA)) and xDSL technology. Such xDSL technology may include Asymmetric Digital Subscriber Line (ADSL), ADSL2, ADSL2+, Very high speed DSL (VDSL), VDSL2, G.Lite, and High bit rate Digital Subscriber Line (HDSL). In addition, the multicarrier apparatuses 102, 104 and 106 may be enabled to communicate using IEEE 802.11 and IEEE 802.16 (WiMAX) wireless technologies.

Signals exchanged between the multicarrier apparatuses 102, 104 and 106 may include multicarrier symbols that each include a plurality of tones or sub-channels. Each of the tones within a multicarrier symbol may have data bits modulated thereon that are intended for delivery from one of the multicarrier apparatuses 102, 104 and 106 to another.

Figure 2:
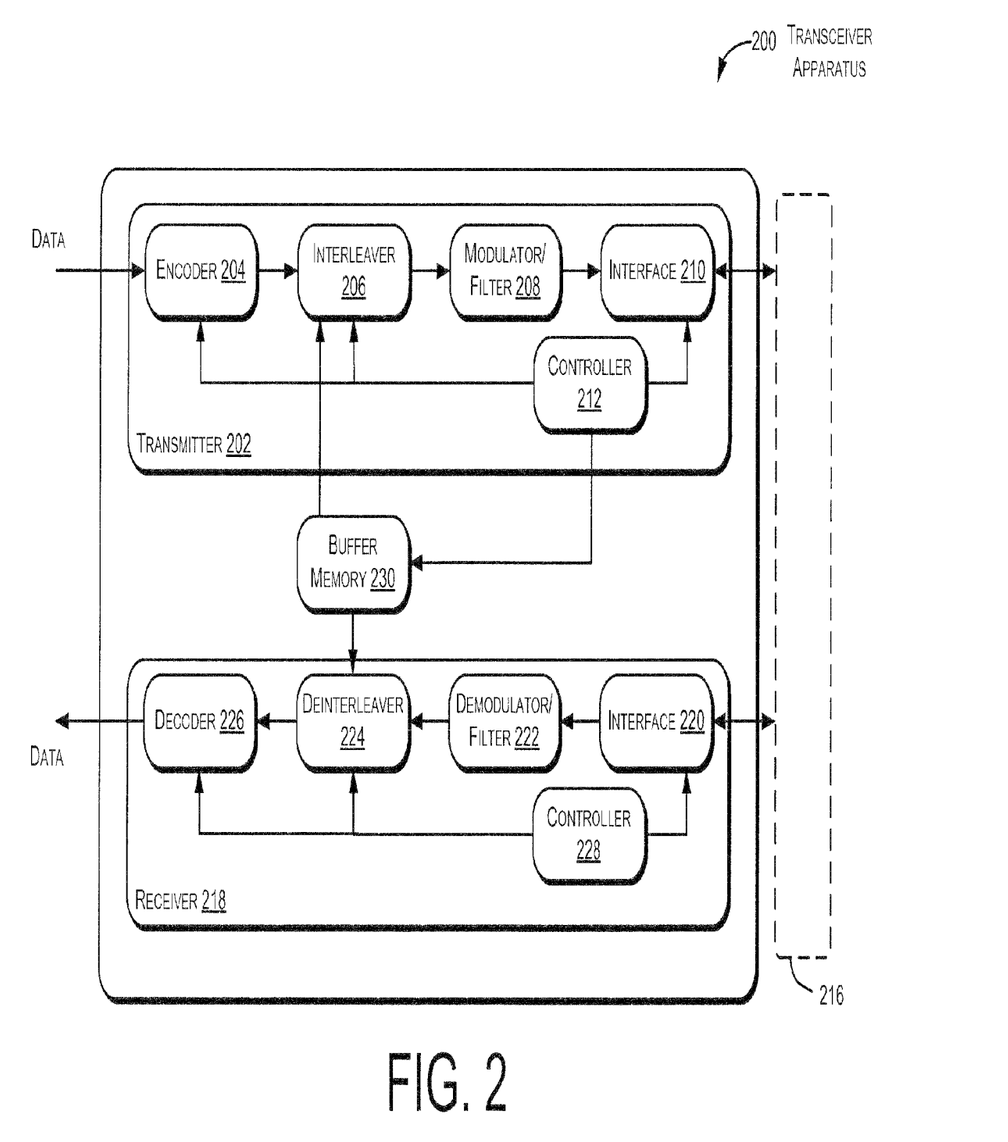
FIG. 2 illustrates an exemplary transceiver apparatus that may be used as a transmitting and receiving apparatus in a multicarrier arrangement or system. The multicarrier apparatuses and multicarrier controller apparatus illustrated in FIG. 1 may be implemented in the same or similar manner as the exemplary transceiver apparatus.

FIG. 2 illustrates an exemplary transceiver apparatus 200 that may be used as a transmitting and receiving apparatus in a multicarrier arrangement or system. The multicarrier apparatuses 102, 104 and 106 illustrated in FIG. 1 may be implemented in the same or similar manner as the exemplary transceiver apparatus 200.

The transceiver apparatus 200 may include a transmitter 202 that incorporates a number of different elements. For example, the transmitter 202 may include an encoder 204, an Interleaver 206, a Modulator/filter 208, an interface 210 and a controller 212. As used herein, the term "controller" is meant generally to include all types of digital processing devices including, without limitation, digital signal processors (DSPs), reduced instruction set computers (RISC), general-purpose (CISC) processors, microprocessors, gate arrays (e.g., FPGAs), PLDs, reconfigurable compute fabrics (RCFs), array processors, secure microprocessors, and application-specific integrated circuits (ASICs). Such digital processors may be contained on a single unitary IC die, or distributed across multiple components.

The encoder 204 may be capable of receiving data that is for communication to a receiving device coupled to the transceiver apparatus 200 via a wireless or wireline medium 216. More specifically, the encoder 204 may be capable of translating incoming data bit streams into in-phase and quadrature components for each of the plurality of tones. The encoder 204 may be arranged to output a number of symbol sequences that are equal to the number of tones available to the system. The interleaver 206 may be configured to receive the symbol sequences from the encoder 204 to interleave the sequences so that adjacent codeword bits are not transmitted in consecutive order. The modulator/filter 208 may receive the interleaved sequences from the interleaver 206 to undergo various modulating/filtering and then the modulated/filtered signal may be passed to the interface 210 for communication over the medium 216 to a receiving device.

The transceiver apparatus 200 may also include a receiver 218 that is capable of receiving modulated multi-tone signals communicated over the medium 216 from a transmitting device. The receiver 218 may include an interface 220, a demodulator/filter 222, a deinterleaver 224, a decoder 226 and a controller 228. Alternatively, the transceiver apparatus 200 may implement a single controller, instead of the illustrated controllers 212 and 228. Signals received by the receiver 218 may be passed to the demodulator/filter 222 via the interface 220. After received signals undergo demodulation/filtering by way of the demodulator/filter 222, the signals may be de-interleaved by the deinterleaver 224. The de-interleaved signals may be passed to and processed by the decoder 226. The decoder 226 produces data bit streams for consumption by a computing device, or the like. Effectively, the deinterleaver 224 and the decoder 226 perform the opposite functions of the Interleaver 206 and the encoder 204, respectively.

The interleaver 206 and the deinterleaver 224 may be coupled to a buffer memory 230, also referred to herein as memory 230. Allocation of the buffer memory 230 may be controlled by the controller 212. Interleaving/deinterleaving (i.e., interleaving) may be implemented by logically segmenting the memory 230 into a downstream interleaver buffer and an upstream deinterleaver buffer.

The memory 230 may be allocated between the interleaver and de-interleaver buffers based on one or more channel conditions as observed by the transceiver apparatus 200. The one or more channel conditions may be one or more upstream channel conditions or one or more downstream channel conditions or a combination of one or more upstream and one or more downstream channel conditions. Therefore, the memory 230 may be better allocated between upstream and downstream flows even when actual channel conditions such as impulse noise levels, user interference, crosstalk, electrical and radio interference, etc. are better or worse than expected.

The memory 230 may be allocated when a new communication channel is initialized by the transceiver apparatus 200. The memory 230 can also be reallocated for a preexisting channel, e.g., when upstream and/or downstream channel conditions change.

The amount of memory 230 allocated between the interleaver and deinterleaver buffers may determined by the controller 212. It is also possible that the controller 228 determines the allocation. The controller 212 may determine upstream and downstream data rate estimates for a new channel based on a plurality of configuration parameters obtained before the channel is initialized by the transceiver apparatus 200. Therefore, the upstream and downstream data rate estimates may be determined based on upstream and downstream data rate, maximum delay and impulse noise protection configuration parameters provided to the transceiver apparatus 200. Normally, such parameters do not reflect actual channel conditions, but instead represent worse-case, best-case or otherwise expected conditions.

In one or more particular implementations, Seamless Rate Adaptation (SRA) may be used to reallocate the interleaver and deinterleaver buffers during Showtime. Showtime refers to a transceiver condition where data transmission (e.g., transmission of user date) is underway. SRA parameters may be used by the controller 212 to reallocate the interleaver and deinterleaver buffers of the memory 230 during Showtime.

The revised use of SRA parameters to reallocate the interleaver and deinterleaver buffers during Showtime may be referred to as Seamless Rate Adaptation Extended (SRAE).

Exemplary procedures are described below. It should be understood that certain acts need not be performed in the order described, and may be modified, and/or may be omitted entirely, depending on the circumstances. The acts described may be implemented and executed by a computer, processor or other computer device, such as a wireless or wireline device (e.g., as illustrated in FIGS. 1 and 2), based on instructions stored on one or more computer-readable storage media associated with the wireless or wireline device and/or associated with other storage media not co-located with the device. The computer-readable storage media can be any available media that can be accessed by a computer device to implement the instructions stored thereon. As used herein, the term "instructions", "computer program" or "software" is meant to include any sequence or human or machine cognizable acts which perform a function. The exemplary procedures and acts may be rendered in virtually any programming language or environment including, for example, C/C++, Fortran, COBOL, PASCAL, assembly language, markup languages (e.g., HTML, SGML, XML, VoXML), and the like, as well as object-oriented environments such as the Common Object Request Broker Architecture (CORBA), Java™ (including J2ME, Java Beans, etc.), Binary Runtime Environment (BREW), and the like. Furthermore, the disclosed exemplary procedures and associated acts may be implemented by hardware and firmware as well, or alternatively as some combination thereof.

In various implementations, it is assumed that there is a multicarrier controller device (master) and a multicarrier device (slave). The multicarrier controller device, having a transmitter and a receiver, communicates with the multicarrier device. The multicarrier controller device transmits to the multicarrier device in the downstream direction. The multicarrier device transmits to the multicarrier controller device in the upstream direction. According to various implementations, the multicarrier controller device may allocate and reallocate interleaver/deinterleaver memory for all paths and in both directions. The multicarrier device may adhere to the interleaver/deinterleaver memory allocation determined by the multicarrier controller device.

Figure 3:
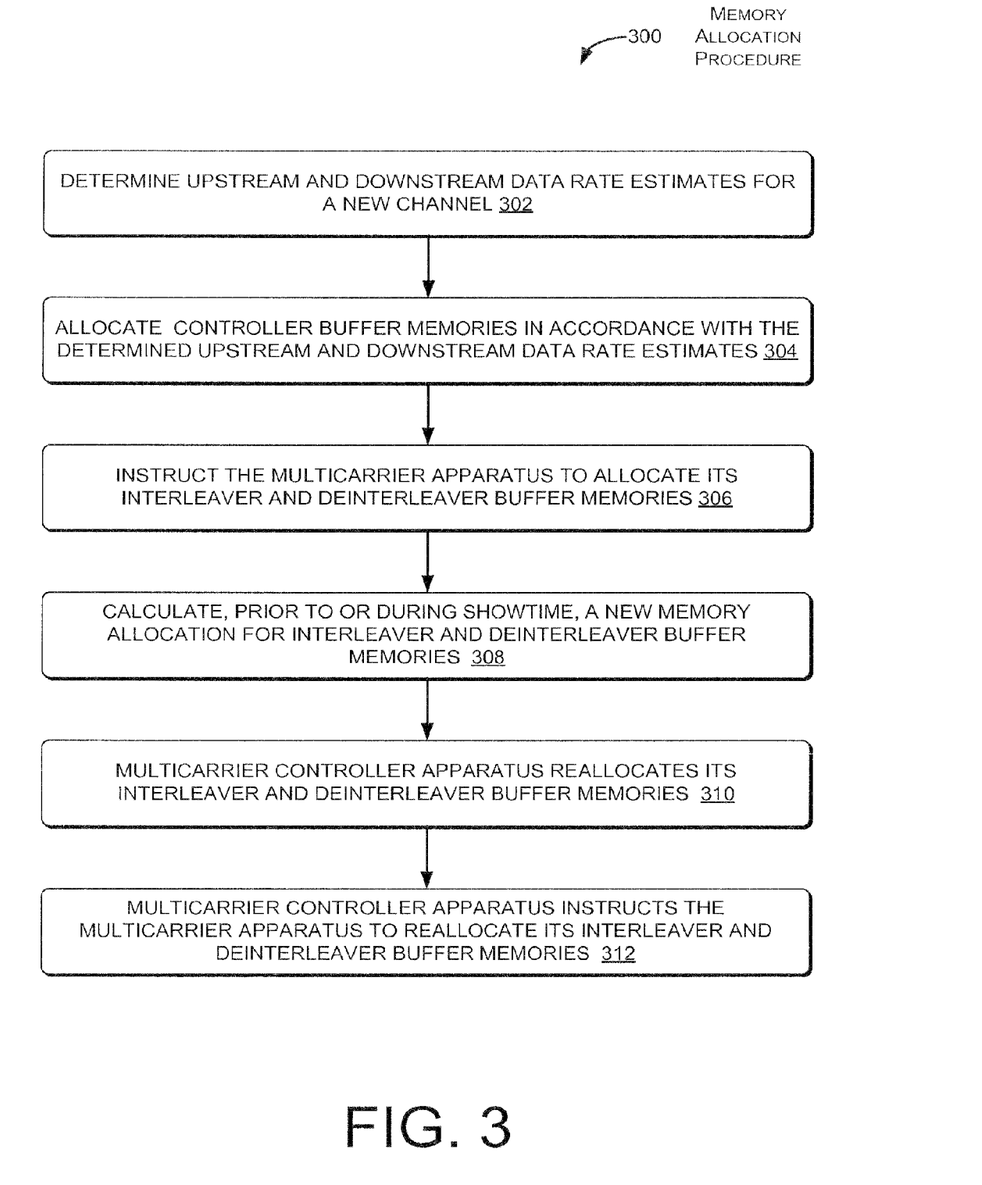
FIG. 3 is a flow diagram of a Memory Split Improvement (MSI) procedure according to various implementations.

FIG. 3 is a flow diagram of a Memory Split Improvement (MSI) procedure 300. At Act 302, a multicarrier controller apparatus may determine upstream and downstream data rate estimates for a new channel based on a plurality of configuration parameters obtained before the channel is initialized by the communication device. The upstream and downstream data rate estimates may be determined based on upstream and downstream data rates, and/or maximum delay and impulse noise protection configuration parameters provided by management information base, as is well known in the art.

At Act 304, the multicarrier controller apparatus allocates its interleaver and deinterleaver buffer memories in accordance with the determined upstream and downstream data rate estimates.

At Act 306, the multicarrier controller apparatus instructs the multicarrier apparatus to allocate its interleaver and deinterleaver buffer memories in the same manner. In one implementation, the multicarrier controller apparatus instructs the multicarrier apparatus using a message that includes max_delay_octets_us and max_delay_octets_ds values.

At Act 308, the multicarrier controller apparatus calculates, during Showtime, a new memory allocation for its interleaver and deinterleaver buffer memories in accordance with the determined upstream and downstream data rate estimates. The upstream and downstream data rate estimates may be determined based on upstream and downstream data rates, and/or maximum delay and impulse noise protection configuration parameters provided by management information base, as is well known in the art.

At Act 310, the multicarrier controller apparatus reallocates its interleaver and deinterleaver buffer memories in accordance with the determined upstream and downstream data rate estimates determined in Act 308.

At Act 312, the multicarrier controller apparatus instructs the multicarrier apparatus to reallocate its interleaver and deinterleaver buffer memories in the same manner. In one implementation, the multicarrier controller apparatus instructs the multicarrier apparatus using a message that includes max_delay_octets_us and max_delay_octets_ds values.

It should be understood that the multicarrier apparatus having an interleaver or deinterleaver buffer memory that is being reduced is to initiate the memory reallocation. For example, in Act 310, in the case of the multicarrier controller apparatus decreasing its deinterleaver buffer (e.g., increasing its interleaver buffer), the multicarrier controller device executes SRAE and modifies its framing parameters such that max_delay_octets_us, interleaving delay, is met but not exceeded. Multiple SRAE requests may be required to decrease the deinterleaver buffer in the case of a single SRAE violating a maximum allowed value for delay variation (DV_max).

In addition, it should be understood, that at Act 312, the multicarrier controller apparatus may communicate a message to the multicarrier apparatus that confirms that it has completed its reallocation of interleaver and deinterleaver memory. Upon receiving the message, the multicarrier apparatus may execute SRAE and modifies its framing parameters such that the max_delay_octets_ds, deinterleaving delay, is met but not exceeded. Multiple SRAE requests may be required to increase the deinterleaver buffer in the case of a single SRAE violating a maximum allowed value for delay variation (DV_max).

In the following description, various details of the foregoing MSI procedure will be further described. The described various details make use of acronyms MSIds and MSIus. MISds refers to a memory increase in the interleaver buffer and a memory decrease in the deinterleaver buffer at the multicarrier controller apparatus. Consequently, MISds refers to a memory increase in the deinterleaver buffer and a memory decrease in the interleaver buffer at the multicarrier device. MISus refers to a memory decrease in the interleaver buffer and a memory increase in the deinterleaver buffer at the multicarrier controller apparatus. Consequently, MISus refers to a memory decrease in the deinterleaver buffer and a memory increase in the interleaver buffer at the multicarrier device.

In one implementation that executes MSIds, the interleaver and deinterleaver memory of the multicarrier device are unknown. The multicarrier controller apparatus calculates, during Showtime, a new memory allocation for its interleaver and deinterleaver buffer memories in accordance with the determined downstream data rate estimates. That is, the multicarrier controller apparatus is to decrease the deinterleaver buffer and increase the interleaver buffer. The downstream data rate estimates may be determined based on upstream and downstream data rates, and/or maximum delay and impulse noise protection configuration parameters provided by management information base, as is well known in the art. In order to increase the interleaver buffer, the multicarrier controller apparatus decreases the deinterleaver buffer, using SRAE, until max_delay_octets_us and max_delay_octets_ds are met. The multicarrier controller apparatus communicates the new max_delay_octets_us and max_delay_octets_ds to the multicarrier apparatus. Therefore, the multicarrier apparatus decreases its interleaver buffer (i.e., increases its deinterleaving buffer) to correspond to the increase of the interleaver buffer at the multicarrier controller apparatus.

In one implementation that executes MSIus, the interleaver and deinterleaver memory of the multicarrier device are unknown. The multicarrier controller apparatus calculates, during Showtime, a new memory allocation for its interleaver and deinterleaver buffer memories in accordance with the determined downstream data rate estimates. That is, the multicarrier controller apparatus is to decrease the interleaver buffer and increase the deinterleaver buffer. The downstream data rate estimates may be determined based on upstream and downstream data rates, and/or maximum delay and impulse noise protection configuration parameters provided by management information base, as is well known in the art. The multicarrier controller apparatus communicates the new max_delay_octets_us and max_delay_octets_ds to the multicarrier apparatus. In order to increase the interleaver buffer, the multicarrier apparatus decreases the deinterleaver buffer until max_delay_octets_us and max_delay_octets_ds are met. The multicarrier apparatus confirms back to the multicarrier controller apparatus that a reallocation of memory has occurred. The multicarrier controller apparatus executes the deincrease in the interleaver buffer and the increase of the deinterleaver buffer in accordance with the new max_delay_octets_us and max_delay_octets_ds. Therefore, the multicarrier controller apparatus increases its deinterleaver buffer to correspond to the increase of the interleaver buffer at the multicarrier apparatus.

The foregoing MSIds and MSIus may be modified to include knowledge of the multicarrier apparatus' interleaver and deinterleaver buffer sizes. That is, in the MSIds procedure, following determining downstream data rate estimates, the multicarrier apparatus is to inform the multicarrier controller apparatus of its buffer sizes. The remaining MSIds procedure does not change. Similarly, in the MSIus procedure, following determining downstream data rate estimates, the multicarrier apparatus is to inform the multicarrier controller apparatus of its buffer sizes. The remaining MSIus procedure does not change.

While the exemplary implementations illustrated herein may show the various components of the arrangement collocated, it is to be appreciated that the various components of the arrangement may be located at distant portions of a distributed network, such as a communications network and/or the Internet, or within a dedicated secure, unsecured and/or encrypted arrangement. Thus, it should be appreciated that the components of the arrangements may be combined into one or more apparatuses, such as a modem, or collocated on a particular node of a distributed network, such as a telecommunications network. Moreover, it should be understood that the components of the described arrangements may be arranged at any location within a distributed network without affecting the operation of the arrangements. For example, the various components can be located in a Central Office modem (CO, ATU-C, VTU-O), a Customer Premises modem (CPE, ATU-R, VTU-R), an xDSL management device, or some combination thereof. Similarly, one or more functional portions of the arrangement may be distributed between a modem and an associated computing device.

The above-described arrangements, apparatuses and methods may be implemented in a software module, a software and/or hardware testing module, a telecommunications test device, a DSL modem, an ADSL modem, an xDSL modem, a VDSL modem, a linecard, a G.hn transceiver, a MOCA transceiver, a Homeplug transceiver, a powerline modem, a wired or wireless modem, test equipment, a multicarrier transceiver, a wired and/or wireless wide/local area network system, a satellite communication system, network-based communication systems, such as an IP, Ethernet or ATM system, a modem equipped with diagnostic capabilities, or the like, or on a separate programmed general purpose computer having a communications device or in conjunction with any of the following communications protocols: CDSL, ADSL2, ADSL2+, VDSL1, VDSL2, HDSL, DSL Lite, IDSL, RADSL, SDSL, UDSL, MOCA, G.hn, Homeplug or the like.

Additionally, the arrangements, procedures and protocols of the described implementations may be implemented on a special purpose computer, a programmed microprocessor or microcontroller and peripheral integrated circuit element(s), an ASIC or other integrated circuit, a digital signal processor, a flashable device, a hard-wired electronic or logic circuit such as discrete element circuit, a programmable logic device such as PLD, PLA, FPGA, PAL, a modem, a transmitter/receiver, any comparable device, or the like. In general, any apparatus capable of implementing a state machine that is in turn capable of implementing the methodology described and illustrated herein may be used to implement the various communication methods, protocols and techniques according to the implementations.

Furthermore, the disclosed procedures may be readily implemented in software using object or object-oriented software development environments that provide portable source code that can be used on a variety of computer or workstation platforms. Alternatively, the disclosed arrangements may be implemented partially or fully in hardware using standard logic circuits or VLSI design. The communication arrangements, procedures and protocols described and illustrated herein may be readily implemented in hardware and/or software using any known or later developed systems or structures, devices and/or software by those of ordinary skill in the applicable art from the functional description provided herein and with a general basic knowledge of the computer and telecommunications arts.

Moreover, the disclosed procedures may be readily implemented in software that can be stored on a computer-readable storage medium, executed on programmed general-purpose computer with the cooperation of a controller and memory, a special purpose computer, a microprocessor, or the like. In these instances, the arrangements and procedures of the described implementations may be implemented as program embedded on personal computer such as an applet, JAVA® or CGI script, as a resource residing on a server or computer workstation, as a routine embedded in a dedicated communication arrangement or arrangement component, or the like. The arrangements may also be implemented by physically incorporating the arrangements and/or procedures into a software and/or hardware system, such as the hardware and software systems of a test/modeling device.

The implementations herein are described in terms of exemplary embodiments. However, it should be appreciated that individual aspects of the implantations may be separately claimed and one or more of the features of the various embodiments may be combined.

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

The invention claimed is:

1. A method of allocating a memory between interleaver and deinterleaver buffers of a multicarrier controller apparatus, the method comprising:
   determining at least one communication channel parameter of a communication channel between the multicarrier controller apparatus and a multicarrier apparatus following training execution and during Showtime; and
   determining, during Showtime, a reallocation of the memory shared between the interleaver and deinterleaver buffers in accordance with the determined at least one communication channel parameter,
   executing, during Showtime, the determined reallocation of the memory shared between the interleaver and deinterleaver buffers,
   wherein said executing of the reallocation includes modifying Seamless Rate Adaptation (SRA) parameters associated with the communication channel during Showtime.

2. The method according to claim 1,
   wherein the SRA parameters are modified during Showtime in accordance with the determined reallocation of the memory shared between the interleaver and deinterleaver buffers.

3. The method according to claim 1,
   wherein said executing of the reallocation of the memory shared between the interleaver and deinterleaver buffers comprises: decreasing a share of the memory allocated to the deinterleaver buffer and increasing a further share of the memory allocated to the interleaver buffer,
   wherein said decreasing of the share of the memory allocated to the deinterleaver buffer occurs before said modifying of the SRA parameters,
   wherein said increasing of the further share of the memory allocated to the interleaver buffer occurs after said modifying of the SRA parameters.

4. The method according to claim 1,
   wherein said modifying of the SRA parameters comprises: the multicarrier controller apparatus transmitting, to the multicarrier apparatus, instructions related to the reallocation of the memory shared between the interleaver and deinterleaver buffers, the instructions corresponding to the modified SRA parameters.

5. The method according to claim 1,
   wherein said modifying of the SRA parameters comprises: the multicarrier controller apparatus receiving, from the multicarrier apparatus, a message confirming reallocation of a memory shared between interleaver and deinterleaver buffers of the multicarrier apparatus.

6. The method according to claim 1,
   wherein said modifying of the SRA parameters during Showtime depends on the determined reallocation of the memory shared between the interleaver and deinterleaver buffers.

7. The method according to claim 1,
   wherein the determining at least one communication channel parameter following training execution and during Showtime includes estimating an upstream capacity of the communication channel based on upstream channel conditions, and
   wherein the determining of the reallocation of the memory shared between the interleaver and deinterleaver buffers in accordance with the determined at least one communication channel parameter includes determining a deinterleaver buffer size that satisfies the upstream capacity estimate.

8. The method according to claim 1,
   wherein the determining at least one communication channel parameter following training execution and during Showtime includes estimating an downstream capacity of the communication channel based on downstream channel conditions, and
   wherein the determining of the reallocation of the memory shared between the interleaver and deinterleaver buffers in accordance with the determined at least one communication channel parameter includes determining an interleaver buffer size that satisfies the downstream capacity estimate.

9. A multicarrier controller apparatus, comprising:
   a memory configured to be allocated between an interleaver buffer and a deinterleaver buffer of the multicarrier controller apparatus; and
   a memory allocation unit configured to: determine at least one communication channel parameter of a communication channel between the multicarrier controller apparatus and a multicarrier apparatus following training execution and during Showtime; and determine, during Showtime, a reallocation of the memory shared between the interleaver and deinterleaver buffers in accordance with the determined at least one communication channel parameter; and execute, during Showtime, the determined reallocation of the memory shared between the interleaver and deinterleaver buffers,
   wherein memory allocation unit is further configured to, as part of said executing of the reallocation: modify Seamless Rate Adaptation (SRA) parameters associated with the communication channel during Showtime.

10. The multicarrier controller apparatus according to claim 9,
    wherein the SRA parameters are modified during Showtime in accordance with the determined reallocation of the memory shared between the interleaver and deinterleaver buffers.

11. The multicarrier controller apparatus according to claim 9,
    wherein memory allocation unit is further configured to, as part of said executing of the reallocation: decrease a share of the memory allocated to the deinterleaver buffer and increase a share of the memory allocated to the interleaver buffer,
    wherein said decreasing of the share of the memory allocated to the deinterleaver buffer occurs before said modifying of the SRA parameters,
    wherein said increasing of the share of the memory allocated to the interleaver occurs after said modifying of the SRA parameters.

12. The multicarrier controller apparatus according to claim 9,
    wherein the memory allocation unit is configured to, as part of said modifying of the SRA parameters: transmit, to the multicarrier apparatus, instructions related to the reallocation of the memory shared between the interleaver and deinterleaver buffers, the instructions corresponding to the modified SRA parameters.

13. The multicarrier controller apparatus according to claim 9,
wherein the memory allocation unit is configured to, as part of said modifying of the SRA parameters: receive, from the multicarrier apparatus, a message confirming reallocation of a memory shared between interleaver and deinterleaver buffers of the multicarrier apparatus.

14. The multicarrier controller apparatus according to claim 9,
wherein said modifying of the SRA parameters during Showtime depends on the determined reallocation of the memory shared between the interleaver and deinterleaver buffers.

15. The multicarrier controller apparatus according to claim 9,
wherein the memory allocation unit is configured to: estimate an upstream capacity of the communication channel based on upstream channel conditions, and determine a memory share of the deinterleaver buffer that satisfies the upstream capacity estimate.

16. The multicarrier controller apparatus according to claim 9,
wherein the memory allocation unit is configured to: estimate downstream capacity of the communication channel based on downstream channel conditions, and determine an a memory share of the interleaver buffer that satisfies the downstream capacity estimate.

17. The multicarrier controller apparatus according to claim 9,
wherein the multicarrier controller apparatus is a Very-high-speed Digital Subscriber Line 2 (VDSL2) capable apparatus.

18. The multicarrier controller apparatus according to claim 9,
wherein the memory allocation unit is configured to: generate an initial estimate of how the memory should be allocated between the interleaver and deinterleaver buffers based on upstream and downstream data rate estimates.

* * * * *